United States Patent [19]

Itoh

[11] Patent Number: 5,266,853
[45] Date of Patent: Nov. 30, 1993

[54] PEAK CLIPPER WITH AN EXPANDED LINEAR CHARACTERISTIC REGION FOR VIDEO SIGNALS

[75] Inventor: Hiroya Itoh, Yokohama, Japan

[73] Assignee: Kabushiki Kaisha Toshiba, Kawasaki, Japan

[21] Appl. No.: 927,717

[22] Filed: Aug. 11, 1992

Related U.S. Application Data

[63] Continuation of Ser. No. 700,449, May 15, 1991, abandoned.

[30] Foreign Application Priority Data

May 17, 1990 [JP] Japan ............................... 2-127468

[51] Int. Cl.[5] .............................................. H03K 5/08
[52] U.S. Cl. ...................................... 307/555; 307/359; 307/562; 358/35
[58] Field of Search ............... 307/362, 359, 540, 546, 307/552, 553, 555, 558, 567; 455/308, 309; 358/35, 167, 36, 170, 172

[56] References Cited

U.S. PATENT DOCUMENTS

| | | | |
|---|---|---|---|
| 4,197,505 | 4/1980 | Nishijima et al. | 307/567 |
| 4,384,219 | 5/1983 | Davis | 307/359 |
| 4,868,429 | 9/1989 | Wölber et al. | 307/540 |

*Primary Examiner*—John Zazworsky
*Attorney, Agent, or Firm*—Finnegan, Henderson, Farabow, Garrett & Dunner

[57] ABSTRACT

A peak clipper according to this invention contains a differential circuit composed of a first and second p-n-p transistors, the first transistor's base terminal receiving the input signal and the second transistor's base terminal receiving a reference voltage for determining a clipping voltage to clip the input signal at a specified voltage level Connected to the collector of the second transistor is a current mirror circuit composed of a third and fourth n-p-n transistors. The current path of the current mirror circuit is connected to the base of a fifth n-p-n transistor, whose emitter is connected to the base of the second transistor. The reference voltage is changed so as to boost the current driving capability of the second transistor at the beginning of the switching operation at the differential circuit.

4 Claims, 3 Drawing Sheets

MODULATING PRESTAGE FOR VIDEO SIGNALS

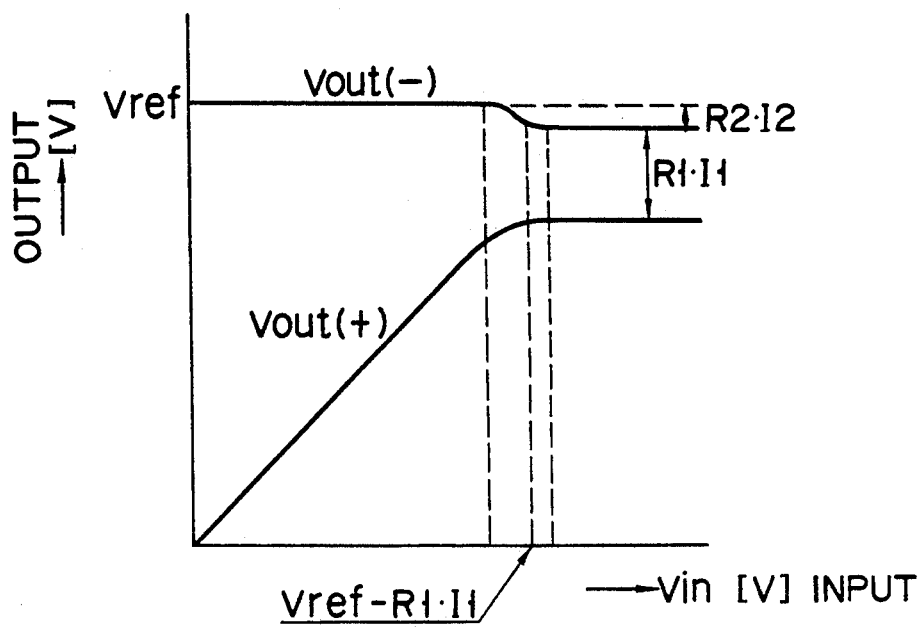
F I G. 2
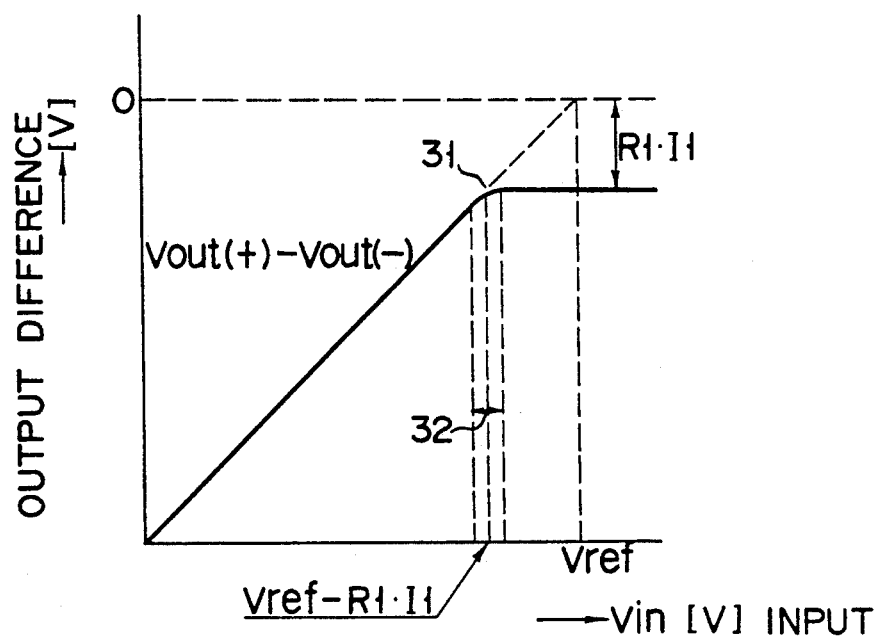
F I G. 3

PEAK CLIPPER WITH AN EXPANDED LINEAR CHARACTERISTIC REGION FOR VIDEO SIGNALS

This application is a continuation-in-part of application Ser. No. 07/700,449 field May 15, 1991, now abandoned.

BACKGROUND OF THE INVENTION

1. Field of the Invention

This invention relates to a peak clipper for use in a pre-stage of the modulating circuit that amplitude-modulates a video signal.

2. Description of the Related Art

A peak clipper is used in the RF modulator built in a VCR (Video Cassette Recorder), for example. The RF modulator converts the processed signal in the VCR into a radio frequency (RF) suitable for television. The peak clipper prevents signals other than the specified video signal, such as noise, from entering the video signal modulating circuit in the RF modulator.

In the clipper circuit operation, it is important that variations in the video signal lower than the clipping level are transmitted to the next stage, maintaining the linear characteristics. Since most peak clippers simply make use of the switching operation at a differential transistor pair, the approach of the clipping level makes the clipping operation slower, worsening the linear characteristics. That is, gradual start of clipping at a voltage below the clipping level makes the linear region narrower. As a result, a signal of high luminance or large amplitude can enter the linearity-collapsed region near the clipping level, which distorts the video signal.

SUMMARY OF THE INVENTION

Accordingly, the subject of the present invention is to provide a peak clipper causing the voltage to make a sharp change in the vicinity of the clipping point.

The foregoing object is accomplished by a peak clipper, comprising: a differential circuit composed of a first and second transistors of a first polarity, the base terminal of the first transistor receiving the input signal and the base terminal of the second transistor receiving a reference voltage for determining a clipping voltage to clip the input signal at a specified voltage level a first voltage supply circuit for supplying as the reference voltage an offset voltage after the switching operation at the differential circuit that clips the input signal; a second voltage supply circuit for supplying as the reference voltage a potential difference proportional to the collector current of the second transistor in such a manner as to apply positive feedback to the base terminal of the second transistor at the beginning of the switching operation at the differential circuit; a positive-phase output terminal connected to the common emitter of the first and second transistors; and a negative-phase output terminal for receiving variations in the potential difference from the first and second voltage supply circuit.

With this arrangement, the second voltage supply circuit, which applies a potential difference proportional to the second transistor's collector current to the second transistor's base terminal in a positive feedback manner, not only promotes the switching operation at the differential circuit, but also lowers the negative-phase output voltage. This approach compensates for slow variations in the differential voltage between the positive-phase and negative-phase outputs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 shows characteristic curves for two outputs in the circuit of FIG. 1;

FIG. 3 shows a characteristic curve for the output difference in the circuit of FIG. 1.

DETAILED DESCRIPTION OF THE PREFERRED EMBODIMENTS

Referring to the accompanying drawings, the present invention will be explained by means of an embodiment.

Figure 1:
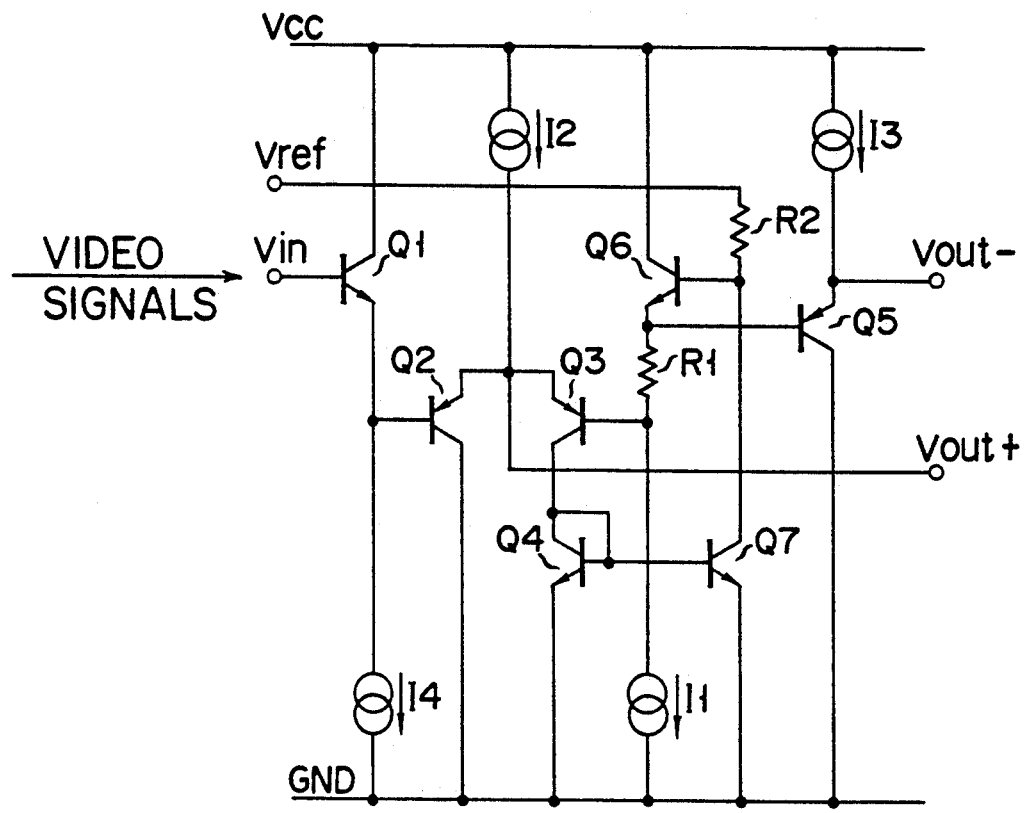
FIG. 1 is a circuit diagram for an embodiment of the present invention.
Figure 4:
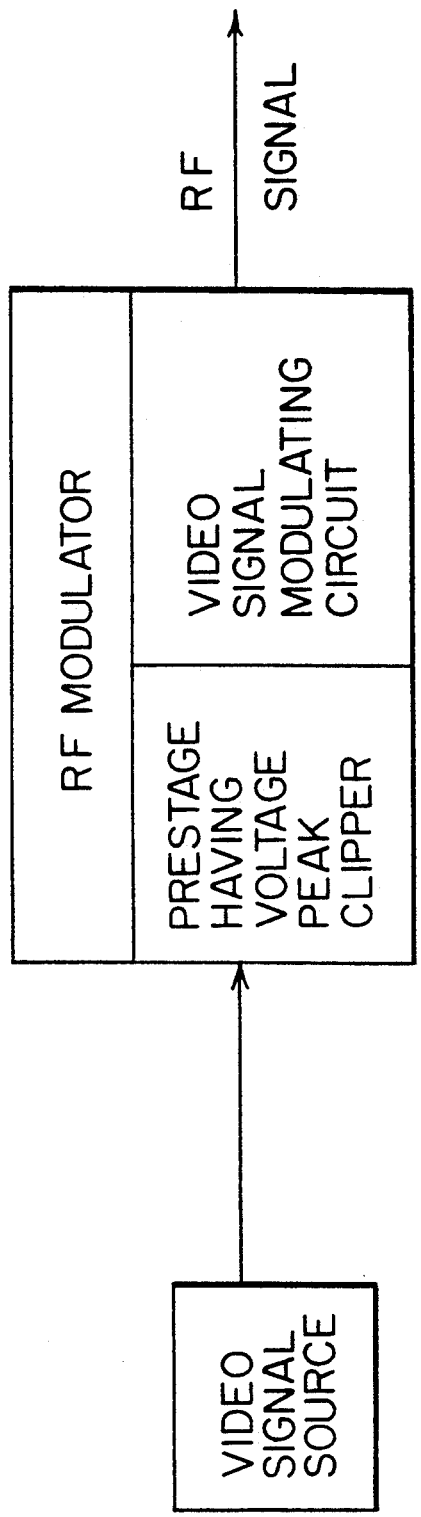
FIG. 4 is a block diagram of a video modulating circuit in which a peak clipper is employed in accordance with the invention.

FIG. 1 is a circuit diagram for a peak clipper according to an embodiment of the present invention. It is assumed that the base-emitter voltage $V_{BE}$ is the same for all of n-p-n and p-n-p transistors constituting the FIG. 1 circuit and that their base currents are all negligible. FIG. 4 shows a video modulating circuit in which the peak clipper circuit of FIG. 1 may be applied.

The input signal $V_{in}$ is supplied to the base of an n-p-n transistor Q1. The transistor Q1 has the collector connected to the supply voltage $V_{CC}$ and the emitter connected to the ground voltage GND via a constant current source I4 as well as to the base of a p-n-p transistor Q2. The transistor Q2 has the collector connected to the GND and the emitter connected to the emitter of a p-n-p transistor Q3. Both emitters of the transistors Q2 and Q3 are connected to $V_{CC}$ via a constant current source I2 as well as to the output terminal for the positive-phase output $V_{OUT}(+)$. The collector of the transistor Q3 is connected to the base and collector of an n-p-n transistor Q4, whose emitter is connected to the GND.

The base of the transistor Q3 is connected to the ground voltage GND via a constant current source I1 as well as to one end of a resistor R1. The other end of the resistor R1 is connected to both the base of a p-n-p transistor Q5 and the emitter of an n-p-n transistor Q6. The transistor Q6 has the collector connected to the supply voltage $V_{CC}$ and the base connected to both. one end of a resistor R2 and the collector of an n-p-n transistor Q7. The other end of the resistor R2 is the input terminal for a reference voltage $V_{ref}$. The transistor Q7 has the base connected to the base of the transistor Q4 and the emitter connected to the GND.

The collector of the transistor Q5, whose base is connected to the other end of the resistor R1, is connected to the GND. The emitter of the transistor Q5 is connected to $V_{CC}$ via a constant current source I3 as well as to the output terminal for the negative-phase output $V_{out}(-)$.

The operation of the circuit thus constructed will now be explained, referring to the characteristic curves in FIGS. 2 and 3. Here, the output value of the circuit is the differential voltage between $V_{out}(+)$ and $V_{out}(-)$ in FIG. 2 and shown in FIG. 3 as $V_{out}(+)-V_{out}(-)$. The circuit is constructed so that with no clipping operation, the extension may have an inclination meeting $V_{out}(+)=V_{out}(-)$ when $V_{in}=V_{ref}$ as indicated by a broken line in FIG. 3.

In the circuit with the above arrangement, the clipping level is set on the basis of a voltage drop of R1·I1. Specifically, when the voltage value of the input signal $V_{in}$ exceeds the voltage value of $v_{ref}$−R1·I1, a clipping operation will take place, with the result that the output value of $V_{out}(+)-V_{out}(-)$ is the voltage of $-R1\cdot I1$ and remains unchanged.

When $V_{in} << (V_{ref}-R1\cdot I1)$, the base of the transistor Q2, which together with the transistor Q3 composes the differential circuit, is impressed by a voltage of $V_{in}-V_{BE}$, causing the transistor Q2 to be on. As a result, there is no current flow in the current mirror circuit composed of the transistors Q4 and Q7, creating no voltage drop across the resistor R2. Thus, the conditions of $V_{out}(+)=V_{in}$ and $V_{out}(-)=V_{ref}$ are established, so that the output varies according to the input.

When $V_{in} >> (V_{ref}-R1\cdot I1)$, the transistor Q2 will be off and transistor Q3 be on, which allows current I2 to flow through the resistor R2 via the current mirror composed of the transistors Q4 and Q7. In this situation, clipping operation takes place to produce $V_{out}(+)$ and $V_{out}(-)$, each given as:

$$V_{out}(+)=V_{ref}-R2\cdot I2-R1\cdot I1 \quad (1)$$

$$V_{out}(-)=V_{ref}-R2\cdot I2 \quad (2)$$

Thus, these outputs are fixed and the following equation is obtained:

$$V_{out}(+)-V_{out}(-)=-R1\cdot I1 \quad (3)$$

In the vicinity of $V_{in}=V_{ref}-R1\cdot I1$, the differential circuit made up of the transistors Q2 and Q3 performs switching operation.

The present invention is characterized in that voltage supply means is employed to apply voltage feedback the base of the transistor Q3, where the reference voltage is supplied to the differential circuit. In this preferred embodiment, the voltage supply means includes the transistor Q6 and its associated circuitry including the resistors R1 and the resistor R2, and the current mirror circuit composed of the transistors Q4 and Q7.

FIG. 2 shows voltage variations in $V_{out}(+)$ and $V_{out}(-)$. As the input signal $V_{in}$ rises close to $V_{ref}-R\cdot 1\cdot I1$, the transistor Q3 starts to turn on, permitting a current equivalent to the collector current of the transistor Q3 to flow through the resistor R2. This lowers the emitter voltage of the transistor Q6, causing the base voltage of the transistor Q3 to fall. This decreased base voltage promotes the switching operation at the differential circuit composed of the transistors Q2 and Q3 and at the same time, lowers the base voltage of the transistor Q5 to decrease the output value $V_{out}(-)$. Thus, setting the resistor R2 and current I2 to suitable values enables variations in $V_{out}(+)$ and $V_{out}(-)$ to cancel out each other, narrowing the region where the output changes in an unideal manner, as shown in FIG. 3.

The transistor Q6 acts as a voltage buffer; the transistor Q1 performs level shift to compensate for the transistor Q6's $V_{BE}$; and the transistor Q5 carries out level shift to compensate for the $V_{BE}$ of the transistors Q2 or Q3. It should be noted that these transistors are not necessarily required.

With the above embodiment, as shown in FIG. 3, slow variations in the differential voltage output at the clipping point 32 is compensated for, which provides a sharp voltage change near the clipping point 32. This narrows the region 31 where the output varies in an unideal manner, thereby broadening the linear region. As a result of this, the distortion of a large-amplitude video signal is improved.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A peak clipper, wherein an output voltage is generated between a positive-phase output terminal and negative-phase output terminal, comprising:

a differential circuit composed of first and second transistors having a first polarity and having respective emitters commonly connected, a base terminal of said first transistor receiving an input signal and a base terminal of second transistor receiving a clipping voltage for clipping said input signal at a predetermined voltage level;

voltage supply means for algebraically adding, after a switching operation is initiated in said differential circuit as a result of the input voltage exceeding the clipping voltage, a feedback voltage having a value proportional to variations of a collector current of said second transistor with said clipping voltage to the base terminal of said second transistor so as to speed up the switching operation of said differential circuit;

the positive-phase output terminal connected to said common emitters of said first and second transistors; and the negative-phase output terminal coupled through said voltage supply means to the base of said second transistor and outputting a shift level of a base potential of said second transistor.

2. A peak clipper according to claim 1, wherein said voltage supply means contains: a current mirror circuit having third and fourth transistors of a second polarity coupled to the collector of said second transistor and switched ON when the difference between the input voltage and the clipping voltage initiates a switching operation of said differential circuit; and a fifth transistor of the second polarity having a base connected to a current path through the current mirror circuit and having an emitter coupled to the base of said second transistor to apply the feedback voltage when said current mirror circuit is switched ON and current flows through said current path.

3. A peak clipper, wherein a voltage difference is generated between a positive-phase output terminal and a negative-phase output terminal, for use in a pre-stage of a modulating circuit which amplitude-modulates a video signal, comprising:

a differential circuit composed of first and second transistors of a first polarity having a common emitter, a base terminal of said first transistor receiving a video signal and a base terminal of said second transistor receiving a clipping voltage for clipping said video signal at a specified voltage level;

voltage supply means for algebraically adding, after a switching operation is initiated in said differential circuit as a result of the input voltage exceeding the clipping voltage, a feedback voltage having a value proportional to variations of the collector current of said second transistor with said clipping voltage to the base terminal of said second transistor so as to speed up the switching operation of said differential circuit;

the positive output terminal connected to said common emitter of said first and second transistors; and the negative-phase output terminal coupled through said voltage supply means to the base of said second transistor and outputting a shifted level of a base potential of said second transistor.

4. A peak clipper according to claim 3, wherein said voltage supply means contains: a current mirror circuit having third and fourth transistors of a second polarity coupled to the collector of said second transistor; and a fifth transistor of the second polarity whose base is connected to a current path through the current mirror circuit and whose emitter is coupled to the base of said second transistor to apply the feedback voltage when said current mirror circuit is switched ON and current flows through said current path.

* * * * *